United States Patent [19]

Maruyama et al.

[11] Patent Number: 5,074,968
[45] Date of Patent: Dec. 24, 1991

[54] METHOD AND APPARATUS FOR STRIPPING STARTING SHEET

[75] Inventors: Tsuneo Maruyama; Hiroji Akii; Yutaka Kataoka, all of Tamano; Kiyotaka Tsuji, Oomuta, all of Japan

[73] Assignee: Mitsui Mining & Smelting Co., Ltd., Tokyo, Japan

[21] Appl. No.: 605,526

[22] Filed: Oct. 29, 1990

[30] Foreign Application Priority Data

Nov. 10, 1989 [JP] Japan .................................. 1-291106

[51] Int. Cl.$^5$ .......................... C25D 1/04; C25D 17/00
[52] U.S. Cl. ........................................ 205/76; 204/194
[58] Field of Search ........................... 204/12, 194, 198

[56] References Cited

U.S. PATENT DOCUMENTS 4,417,953 11/1983 Viellefont .............................. 204/12
4,840,710 6/1989 Middlin ................................. 204/12

Primary Examiner—T. M. Tufariello
Attorney, Agent, or Firm—Felfe & Lynch

[57] ABSTRACT

An apparatus for stripping starting sheets of the present invention comprises stripping rods which are horizontally disposed at positions opposite to the right and left sides of both surfaces of a mother board, which is stripped at the upper end and is suspended and transferred by a trolley conveyor, so that they can be inserted into the stripped upper end when the mother board reaches a predetermined stripping position; elevating members which respectively carry the stripping rods through attachments so as to upwardly and downwardly move the stripping rods at small distances from the surfaces of the mother board between an upper position above the stripped upper end of the mother board and a lower position under the lower ends of the starting sheets; and a driving member for upwardly and downwardly moving the elevating members in synchronism with each other.

6 Claims, 6 Drawing Sheets

FIG. I

METHOD AND APPARATUS FOR STRIPPING STARTING SHEET

BACKGROUND OF THE INVENTION

The present invention relates to a method and an apparatus for stripping from a mother board starting sheets, which are electrodeposited thereon by electrolysis.

Since the work of stripping from a mother board starting sheets, which are electrodeposited on both surfaces thereof, putting the sheets one on top of the other and storing them in a container is simple but a heavy labor, various apparatuses for stripping starting sheets have been previously proposed which comprise combination of hammering, vacuum evaporation, a scraper and so forth.

An example of the apparatuses is disclosed in Japanese Patent Laid-Open No. 59-50189 in which a forked scraper is downwardly moved until it passes through the lower ends of starting sheets so as to strip the starting sheets from a mother board.

However, stripping by such a method using a scraper has a problem in that, since the scraper is upwardly and downwardly moved in contact with both surfaces of the mother board during the stripping, the surfaces of the mother board are damaged and, thus, the surfaces must be regularly ground, resulting in a reduction in life of the mother board.

SUMMARY OF THE INVENTION

It is an object of the present invention to solve the above-described problem of prior art and provide a stripping method and apparatus which do not damage the surfaces of a mother board during stripping, which are capable of simply and rapidly stripping starting sheets, and which permit easy maintenance and an increase in efficiency of the stripping work.

In order to achieve the object, a method of stripping starting sheets in accordance with the present invention comprises stripping starting sheets from a mother board by using stripping rods which are downwardly moved at a small distance from the surfaces of the mother board by elevating members, which respectively carry the stripping rods, from two open portions over the entire upper portion of the mother board when the mother board, which has been stripped over the upper portion thereof by a pre-stripping apparatus, reaches a predetermined stripping position, the stripping rods being horizontally disposed opposite to each other at the right and left sides of both surfaces of the mother board.

Such a stripping method produces no damage to the surfaces of the mother board during stripping, as conventional scrapers, and permits the use of the mother board for a long time.

An apparatus for stripping starting sheets in accordance with the present invention comprises stripping rods, which are horizontally disposed opposite to each other at the right and left sides of both surfaces of the mother board so that they can be inserted into open portions when the mother board, which has been stripped in the upper portion and transferred while being suspended by a trolley conveyor, reaches a predetermined stripping position; elevating members which respectively carry the stripping rods through attachments and which upwardly and downwardly move the stripping rods at small distances from the surfaces of the mother board within the region between an upper position above the open portion of the -mother board and a lower position under the lower ends of the starting sheets; and a driving member for downwardly and upwardly moving the elevating members in synchronism.

Such a stripping apparatus can be operated in linkage with pre-stripping apparatuses such as a hammering apparatus, an opening apparatus and the like, with the trolley conveyor, which has been previously provided, being hardly reconstructed. It is therefore possible to achieve the complete automation of the stripping apparatus. In addition, since the apparatus is capable of simply and rapidly stripping starting sheets by using the four stripping rods in total, the efficiency of the stripping work can be increased, and the maintenance can be easily made.

DETAILED DESCRIPTION OF PREFERRED EMBODIMENT

Figure 1:
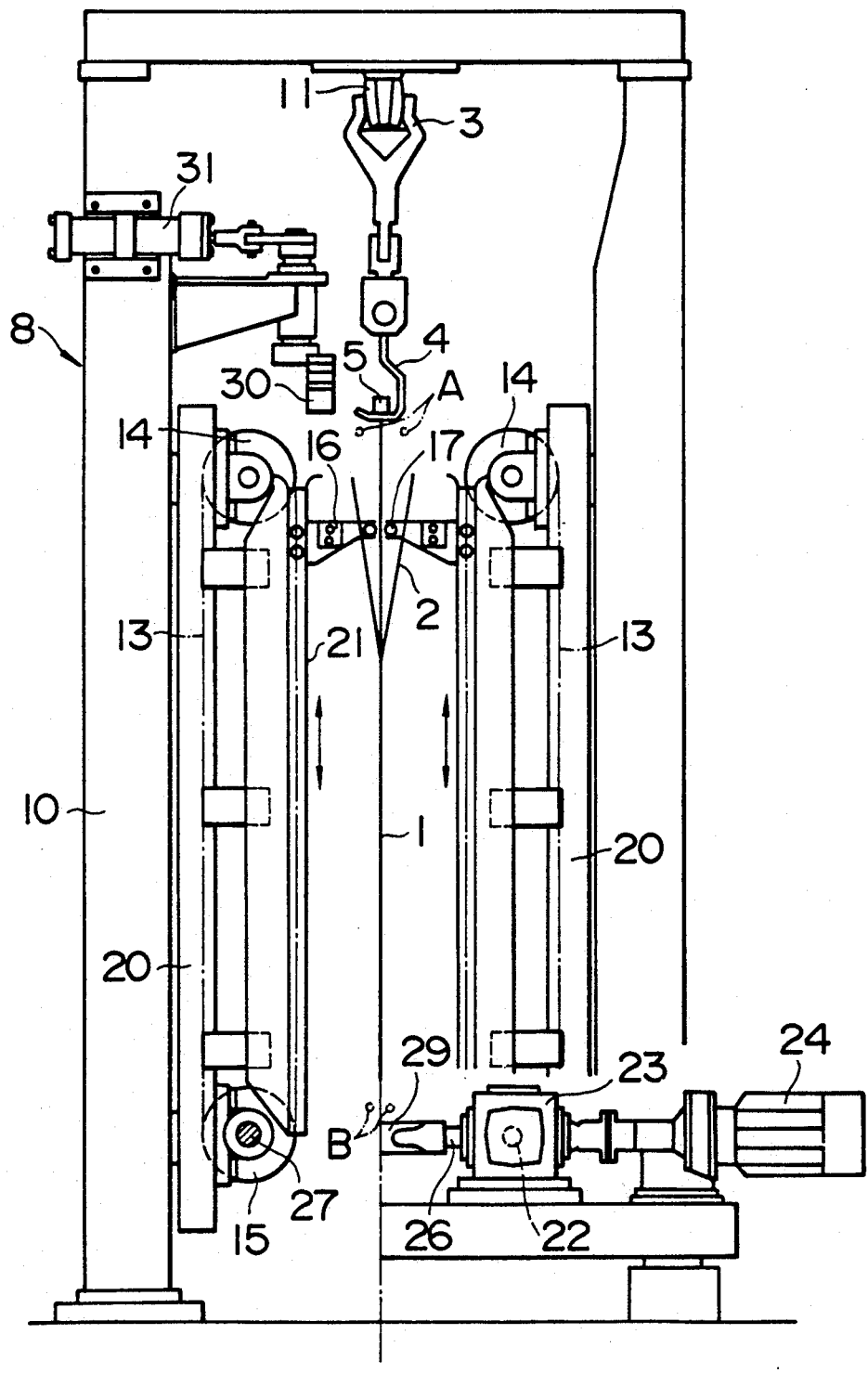
FIG. 1 is a partially-omitted front view of an embodiment of an apparatus for stripping starting sheets in accordance with the present invention.
Figure 2:
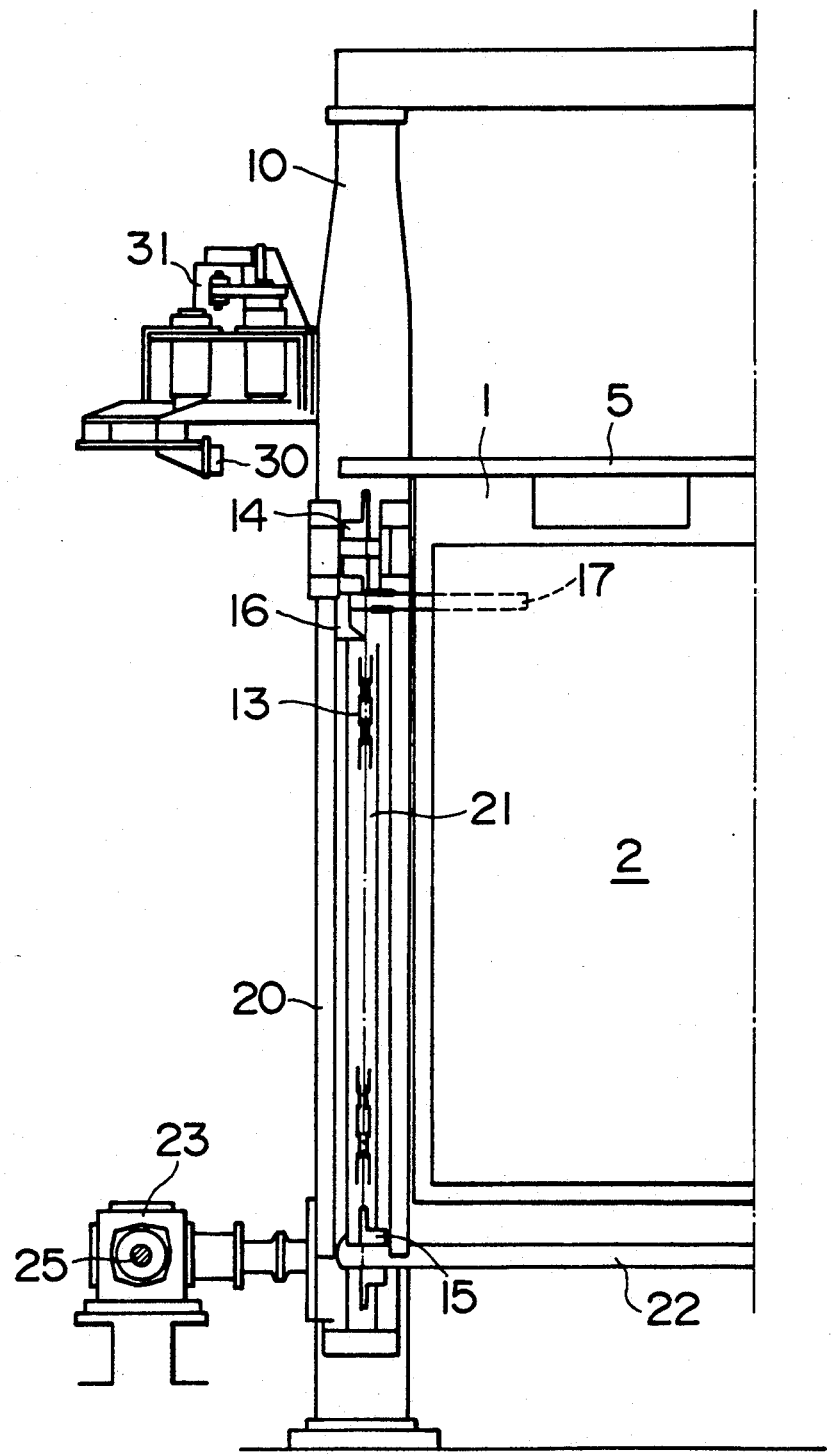
FIG. 2 is a side view of the left half of the embodiment shown in FIG. 1.
Figure 3:
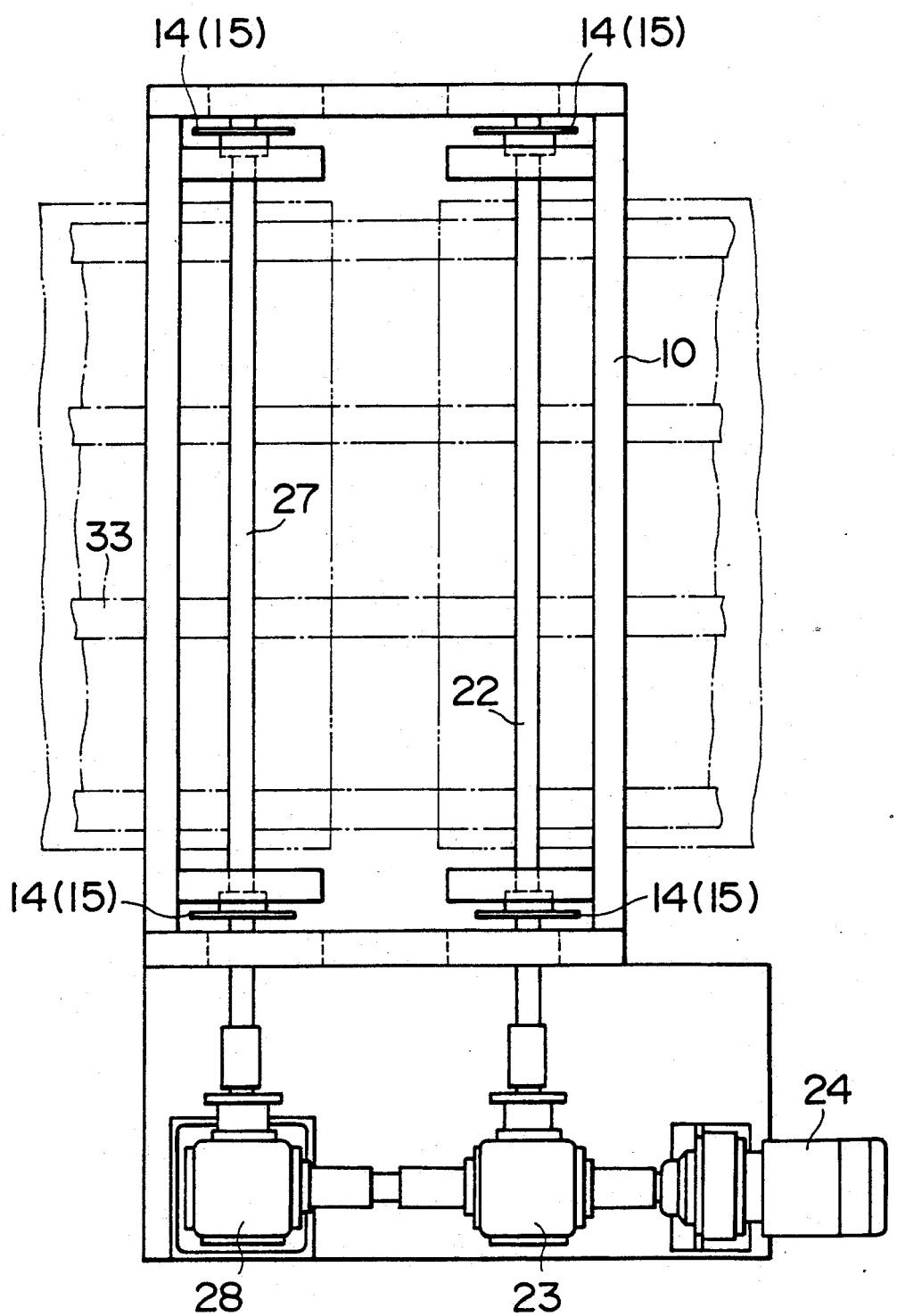
FIG. 3 is a plan view of the embodiment shown in FIG. 1.
Figure 4:
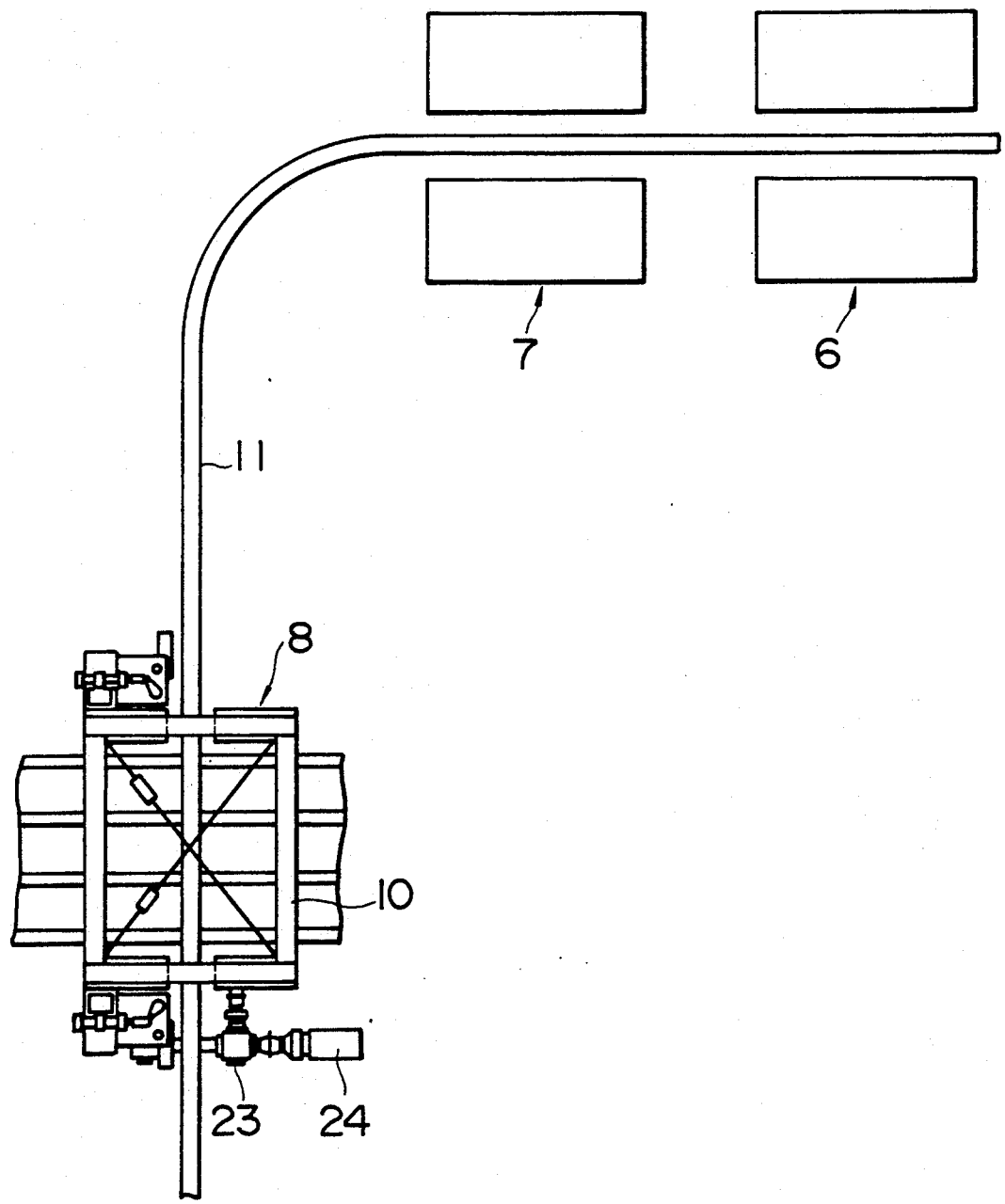
FIG. 4 is a schematic plan view of the whole of the apparatus including a hammering apparatus and an opening apparatus.

In the embodiment shown in FIGS. 1 to 3, reference numeral 1 denotes a negative plate (mother board), and reference numeral 2 denotes metal plates (starting sheets) which are electrodeposited on both surfaces of the mother board 1. A cross bar 5 at the upper end of the mother board 1 is engaged with the hook 4 provided on a trolley conveyor 3 in order to suspend the mother board 1. The mother board 1 is also stripped several tens mm from the starting sheets 2 over the entire upper ends of the starting sheets 2 when the mother board 1 is passed through the hammering apparatus and the opening apparatus 7 employing vacuum attraction, both of which are shown in FIG. 4. The mother board 1 is then intermittently transferred to a stripping apparatus 8.

The stripping apparatus 8 has a rectangular frame 10 which is provided with a trolley conveyor rail 11 on its head. Endless chains 13 are respectively disposed in portions of the frame 10, which correspond to the right and left sides of both surfaces of the mother board, so as to be placed over the regions between sprockets 14 opposite to the upper ends of the mother board 1 and sprockets 15 opposite to the lower ends thereof when the mother board 1 is transferred to the stripping apparatus 8 by the trolley conveyor 3 and stopped at the predetermined stripping position shown in FIGS. 1 and 2.

Each of stripping rods 17 has an end which horizontally extends toward a surface of the mother board 1 through an attachment 16 and a base end which is provided on each of the chains 13. For example, each of the stripping rods 17 has a diameter of about 20 mm and a length of about 200 mm and is placed at a distance of several tens mm from each of the surfaces of the mother board 1 when the mother board 1 is stopped at the predetermined stripping position. Further, each of the stripping rods 17 is preferably formed into a round bar or a pipe so as not to damage the mother board 1 and the stripping sheets 2. The stripping rods 17 are respectively in a stand-by state at upper positions so as not to contact with the mother board 1 and the starting sheets 1. When the mother board 1 is transferred and stopped at the predetermined stripping position, the stripping rods 17 are inserted into upper open portions between the mother board 1 and the starting sheets 2 and then downwardly moved to the lower position under the mother board 1 from the upper stand-by position above the mother board 1 when the chains 13 are rotated so that the starting sheets 2 are stripped from the mother board 1.

Reference numeral 20 denotes sprocket mounting bases which are fixed to the frame 10, reference numeral 21 denote guides for the chains 13, and reference numeral 22 denote a rotational shaft which is placed between the right and left sprockets 15, as shown in FIG. 2. A miter gear (not shown) is provided at the end outwardly projecting from the sprocket 15 at one end of the rotational shaft 22 and is contained in a gear box 23. The miter gear engages with a miter gear (not shown) which is provided at one end of the rotational shaft 25 connected to the shaft of a reversible driving motor 24 through coupling, as well as a miter gear (not shown) which is provided at the base end of a rotational shaft 26.

A rotational shaft 27 is also placed between the sprockets 25 on the rear side, as shown in FIG. 2, and a miter gear (not shown) is provided at the end which outwardly projects from the sprocket 15 at one of the rotational shaft 27 and is contained in a gear box 28, in the same way as that described above. The miter gear in the gear box 28 engages with the miter gear which is provided at the base end of a miter gear of a rotational shaft (not shown). The front end of this rotational shaft is connected to the front end of the rotational shaft 26 through a universal joint 29. This arrangement permits the rotational shafts 22, 27 to be rotated in the opposite directions through the miter gears, the universal joint 29 and so on. The arrangement also permits the stripping rods 17 on the chains 13, which are respectively placed between the sprockets 15 and the sprockets 14 of the rotational shafts 22 and 27, to be downwardly and upwardly moved synchronously with each other in the arrow direction shown in FIG. 1. The motor 24 is controlled by an inverter so that the moving speed of the stripping rods 17 can be changed corresponding to the adhesive strength between the mother board 1 and the starting sheets 2.

Reference numeral 30 denotes a centering apparatus for the mother board 1 which is forwardly moved by the operation of a cylinder 31 so as to press both sides of the cross bar 5 and set the mother board 1 at the predetermined stripping position.

A description will now be given of the function of the above embodiment.

When the mother board 1, which is stripped from the starting sheets 2 over the upper portions thereof by the hammering apparatus 6 and the opening apparatus 7, is intermittently transferred by the trolley conveyor 3 and reaches the stripping apparatus 8, the centering apparatus 30 is first forwardly moved by the operation of the cylinder 31 so as to press both sides of the cross bar 5 of the mother board 1 and set the mother board 1 at the predetermined stripping position.

Figure 5:
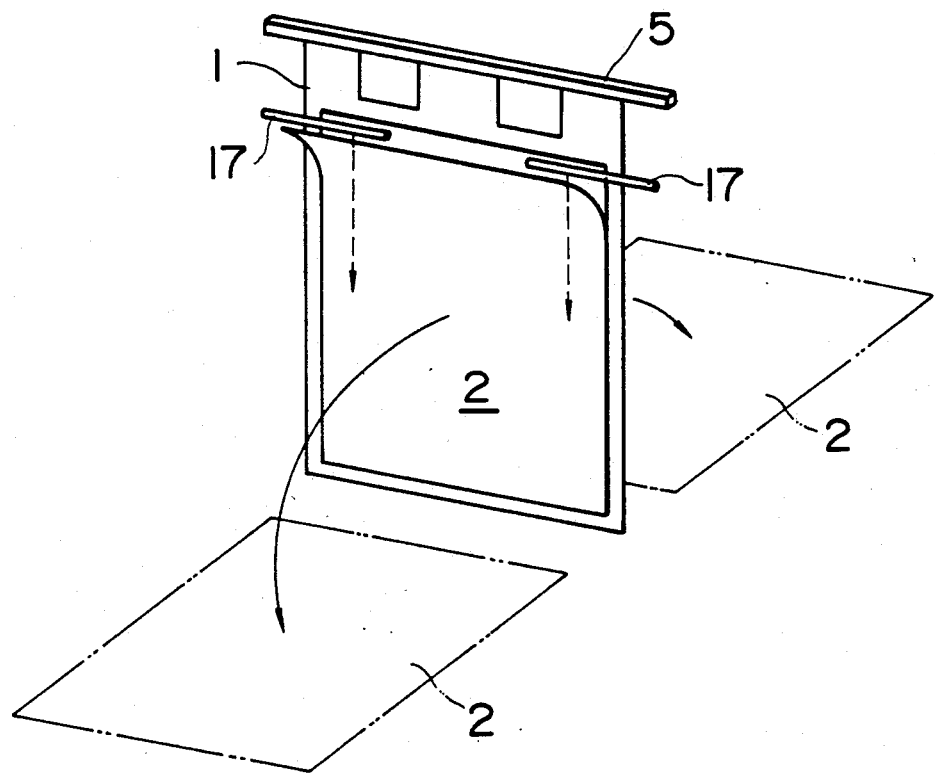
FIG. 5 is a perspective view which shows the process of stripping starting sheets from a mother board by stripping rods.

The motor 24 is then driven to normally rotate, and the stripping rods 17 on the chains 13 are inserted into the open portions between the upper sides of the starting sheets 2 and the mother board 1, by the rotational shafts 22, 27, which are rotated by this normal rotation, the sprockets 14, 15 and the chains 13. The stripping rods 17 are downwardly moved from the upper stand-by position (set to an appropriate position, e.g., position A shown in FIG. 1, where the stripping rods 7 do not contact with the mother board 1, the starting sheets 2 and the hook 4 during the transfer of the mother board 1), without contacting with the surfaces of the mother board 1. The downward movement of the stripping rods 17 causes the gradual stripping of the starting sheets 2 from the mother board 1. When the stripping rods 17 reaches the stripping end position (shown by B in FIG. 1) under the lower end of the mother board 1, the starting sheets 2 are completely stripped. During the stripping, the starting sheets 2 do not fall in the vertical direction under gravitation but fall down on the transfer conveyor 33 (FIG. 3) disposed under the stripping sheets 2 so as to rotate through 90° while maintaining substantially the original form thereof, as shown by arrows in FIG. 5. The starting sheets 2 on the front side and the rear side of the mother board 1 fall down in the opposite directions. If the adhesive force between the starting sheets 2 and the mother board 1 is changed, since the way of falling is changed, the downward moving speed of the stripping rods 17 is appropriately selected.

When the stripping of the starting sheets 2 is completed, the centering apparatus 30 is backwardly moved by the cylinder 31 so that the pressure on both sides of the cross bar 5 of the mother board 1 is released. At the same time, the motor 24 is driven to rotate in the reverse direction. This reverse rotation causes the stripping rods 17 on the chains 13 to be returned to the upper stand-by position from the stripping end position. When one cycle is completed, the stripping rods 17 wait for the arrival of the next mother board 1 at the stripping position.

Figure 6:
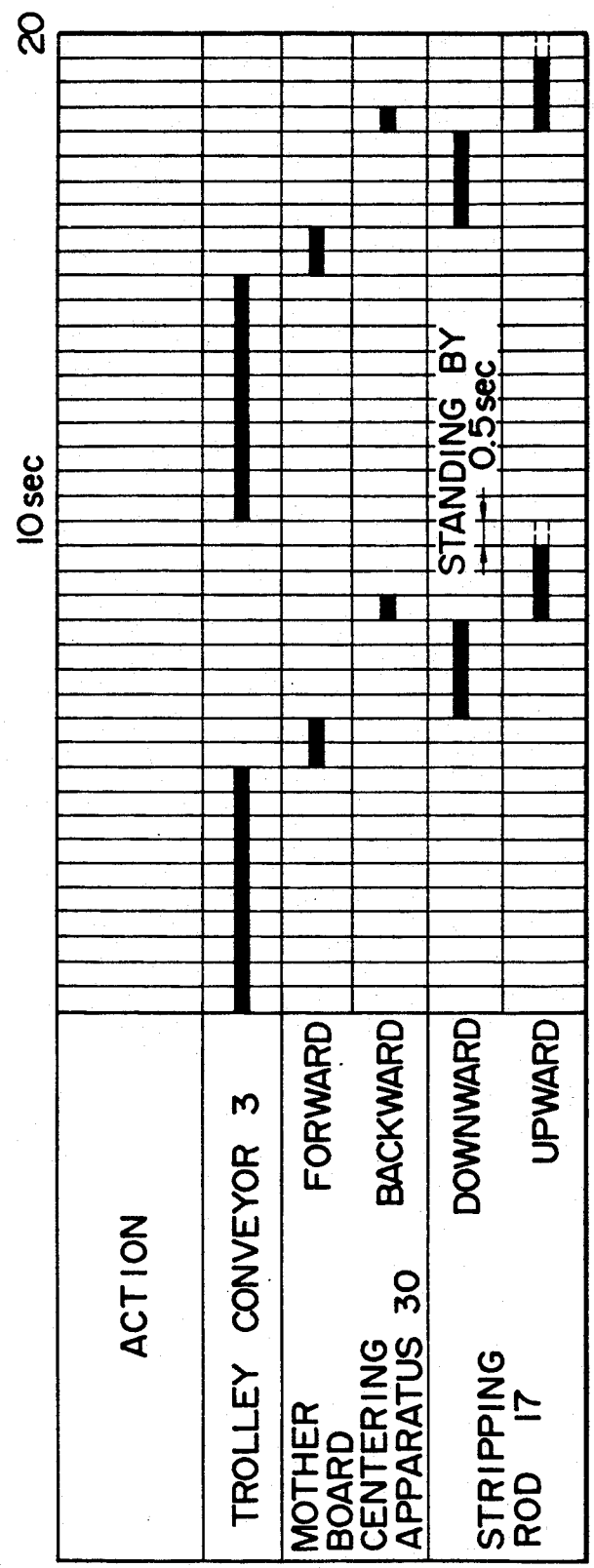
FIG. 6 is an operation timing chart of a trolley conveyor, a mother board centering apparatus and stripping rods.

The stripping speed for one mother board, i.e., one cycle, is 10 seconds, as shown in the time chart in FIG. 6.

Although the above-described embodiment concerns the copper starting sheets 2, the starting sheets 2 are not limited to them, and the present invention can be applied to negative starting sheets which can be stripped by bending the sheets more or less and which are curved under gravitation.

Although a particular preferred embodiment of the invention has been disclosed in detail for illustrative purposes, it will be recognized that variations or modifications of the disclosed apparatus, including the rearrangement of parts, lie within the scope of the present invention.

What is claimed is:

1. A method of stripping starting sheets, which are electrodeposited on both surfaces of a mother board suspended and transferred by a trolley conveyor, therefrom after upper portions of said starting sheets have been entirely stripped by pre-stripping apparatuses, said method comprising: when said mother board opened reaches, a predetermined stripping position, synchronously downwardly moving stripping rods by elevating members, which respectively carry said stripping rods, from said open upper portions at a small distance from the surfaces of said mother board so as to strip said starting sheets from said mother board, said stripping rods being horizontally disposed opposite to each other at the right and left sides of both surfaces of said mother board.

2. An apparatus for stripping starting sheets comprising: stripping rods which are horizontally disposed at positions opposite to the right and left sides of both surfaces of a mother board, which is stripped at the upper end and is suspended and transferred by a trolley conveyor, so that they can be inserted into the stripped upper end when said mother board reaches a predetermined stripping position; elevating members which respectively carry said stripping rods through attachments so as to upwardly and downwardly move said stripping rods at small distances from the surfaces of said mother board between an upper position above said stripped upper end of sad mother board and a lower position under the lower ends of said starting sheets; and a driving member for upwardly and downwardly moving said elevating members in synchronism with each other.

3. An apparatus for stripping starting sheets according to claim 2, wherein each of said stripping rods is formed into a round bar or a pipe.

4. An apparatus for stripping starting sheets according to claim 2, wherein each of said elevating members is an endless chain placed between the sprockets provided at positions on a frame corresponding to the upper and lower sides of said mother board.

5. An apparatus for stripping starting sheets according to claim 2, wherein said driving member comprises a reversible driving motor.

6. An apparatus for stripping starting sheets according to claim 5, wherein said reversible driving motor can be controlled by an inverter so that the moving speed of said stripping rods can be changed corresponding to the adhesive force between said mother board and said starting sheets.

* * * * *